United States Patent [19]
Wong et al.

[11] Patent Number: 5,438,278
[45] Date of Patent: Aug. 1, 1995

[54] HIGH SPEED CMOS OUTPUT BUFFER CIRCUIT MINIMIZES PROPAGATION DELAY AND CROWBAR CURRENT

[75] Inventors: Jack T. Wong, Fremont; Fabiano Fontana, Santa Clara; Henry Law, Cupertino, all of Calif.

[73] Assignee: Advanced Micro Devices, Inc., Sunnyvale, Calif.

[21] Appl. No.: 128,628

[22] Filed: Sep. 28, 1993

[51] Int. Cl.$^6$ .................. H03K 17/16; H03K 19/0175
[52] U.S. Cl. ........................................ 326/27; 326/17; 326/83
[58] Field of Search ......................... 307/443, 451, 475; 326/29, 30, 27, 83, 58

[56] References Cited

U.S. PATENT DOCUMENTS

| | | | |
|---|---|---|---|
| 4,731,553 | 3/1988 | Van Lehn et al. | 307/443 |
| 4,789,796 | 12/1988 | Foss | 307/443 |
| 5,003,205 | 3/1991 | Kohda et al. | 307/443 |
| 5,148,056 | 9/1992 | Glass et al. | 307/443 |
| 5,149,991 | 9/1992 | Rodgers | 307/443 |
| 5,153,450 | 10/1992 | Ruetz | 307/443 |
| 5,296,757 | 3/1994 | Koizumi | 307/443 |
| 5,315,172 | 5/1994 | Reddy | 307/443 |
| 5,317,206 | 5/1994 | Hanibuchi et al. | 307/443 |

*Primary Examiner*—Edward P. Westin
*Assistant Examiner*—Richard Roseen
*Attorney, Agent, or Firm*—Raymond Kam-On Kwong; Joseph A. Sawyer, Jr.; Judy M. Maher

[57] ABSTRACT

An output buffer circuit is disclosed that minimizes propagation delay and crowbar current. This circuit receives a data input signal and provides an output signal. This circuit includes a pull-up transistor, a first pull-down transistor, a speed improvement circuit and a crowbar current reduction circuit. The speed improvement circuit comprises an inverter with small propagation delay coupled to a second pull-down transistor which is smaller than the first pull-down transistor. The speed improvement circuit minimizes the propagation delay of the circuit when the data input signals changes from a high logic level to a low logic level by speeding up the initial rate of fall of the output signal due to the fast turning on of the second small pull-down transistor which receives the data input signal quickly through the small-propagation-delay inverter. The crowbar current reduction circuit comprises a first crowbar current reduction transistor which is smaller than the pull-up transistor. The crowbar current reduction circuit minimizes the crowbar current through the pull-up transistor and the first pull-down transistor when the data input signals changes from a high logic level to a low logic level by speeding up the turning off of the pull-up transistor due to the fast turning on of the small first crowbar current reduction transistor which receives the data input signal quickly through the small-propagation-delay inverter. A split Ground metal bus and a split package lead are used for minimizing noise.

22 Claims, 4 Drawing Sheets

HIGH SPEED CMOS OUTPUT BUFFER CIRCUIT MINIMIZES PROPAGATION DELAY AND CROWBAR CURRENT

FIELD OF THE INVENTION

This invention relates generally to semiconductor integrated circuits and particularly, it relates to a high speed CMOS output buffer which has minimal propagation delay and transient crowbar current.

BACKGROUND OF THE INVENTION

As is well-known in the art, output buffers are commonly used with a variety of electronic and computer type integrated circuits. Specifically, the output buffer circuit provides, when enabled, an output signal which is a function of a data input signal from other logic circuitry of the integrated circuit.

Output buffer circuits typically use a pull-up transistor device and a pull-down transistor device connected in series between first and second power supply terminals. The first power supply terminal may be supplied with a positive potential VCC, which is connected to an internal power supply potential node. A second power supply terminal may be supplied with a ground potential, which is connected to an internal ground potential node. The connection point of the pull-up and pull-down transistors is further joined to an output terminal. The output terminal is used for driving other circuitry on other integrated circuits which may have widely varying capacitive loading effects.

When a data input signal is transmitted through the integrated circuit, there is a certain amount of time delay for the data input signal to travel through the integrated circuit before it arrives at the output terminal as an output signal. The time delay is commonly known as propagation delay. In smaller integrated circuits where the propagation delay through the circuit is very short, the propagation delay due to the output buffer represents a high percentage of the propagation delay for the entire integrated circuit. Thus a great deal of effort has been expended over the years to reduce the output buffer propagation delay in order to speed up the performance of smaller integrated circuits.

Furthermore, depending upon the logic state of the data input signal and an enable signal, either the pull-up or the pull-down transistor is quickly turned ON and the other is turned OFF. Such rapid ON and OFF switching of the pull-up and pull-down transistor devices causes sudden surges of current creating what is commonly known as current spikes. Also, during output switching, charging and discharging currents from the pull-up and pull-down transistors to the external capacitance load exist. These transient current (current spikes and charging/discharging currents) will flow through the impedance and inductive components of power supply and ground lines so as to cause noises at the internal power supply potential and the internal ground potential nodes of the output buffer. The noise at the internal ground potential is undesirable because it will degrade the logic "1" and logic "0" voltage levels which are commonly used in digital circuits, causing interfacing problems among the output buffer circuit and other integrated circuits. The undesirable ground noise is generally referred to as "ground bounce". The ground bounce will be more severe when more output buffers are switching simultaneously, at higher operating speed, or driving larger external capacitance loads.

In the design of output buffer circuits, it is thus seen that a trade-off exists between achieving high-speed/high-drive operation and minimizing of the ground bounce. As the demand for higher speed circuits dominates more and more in the market place, output buffers are found to be either unacceptable in speed performance or are too noisy to be used practically. Accordingly, there has been a long-felt but unsatisfied need to provide output buffer circuits which operate at high speed and yet minimize ground bounce.

In addition, during the rapid ON and OFF switching of the pull-up and pull-down transistor, there exists a condition in which the pull-up transistor remains ON temporarily as it is being turned OFF while the pull-down transistor is being turned ON. This causes a sudden surge of current flowing from VCC through the pull-up and pull-down transistor to ground, creating what is commonly known as crowbar current. A parameter which is commonly used for measurement of power in a CMOS integrated circuit chip is the dynamic current, commonly known as ICC, which is the average sum of all the switching current from the internal and output buffers at a specific frequency. The crowbar current in the output buffer is part of the switching current and contributes a significant percentage to the ICC. Hence high crowbar current will cause high dynamic ICC, and accordingly, an undesirably high total power consumption of the integrated circuit chip.

Attempts have been made previously to achieve higher speed and higher output drive currents when the data input changes from a high logic level to a low logic level by increasing the sizes of the output pull-down transistor. However, it is known that large transistors have large gate capacitance which increase propagation delay. In order to minimize the adverse effect of large gate capacitance in large transistors, the transistors must be buffered by additional buffers, such as inverter gates. Such additional buffers will increase the delay time which may offset the reduction of delay time due to the increase in size of the transistors. As a result, the overall improvement in propagation delay by simply increasing the size of the output pull-down transistor is minimal. Further, increasing the size of the output pull-down transistor results in the disadvantage of increasing the ground bounce due to the increase in the amount of current flowing through a larger transistor. In other words, in order to minimize the ground bounce for the prior art output buffer circuit design, the high-speed or high-drive needs to be sacrificed. In addition, these solutions do not address the problems associated with crowbar current.

Accordingly, what is needed is an output buffer circuit that is flexible and is simple to implement. What is also needed, is an output buffer circuit which reduces the propagation delay associated with previously known output buffer circuits when the data input signal changes from a high logic level to a low logic level, while at the same time does not increase the ground bounce. Finally, what is needed is an output buffer circuit which minimizes crowbar current and hence power consumption.

The present invention provides an output buffer circuit which minimizes the propagation delay of the output buffer circuit when the data input signal changes from a high logic level to a low logic level, while maintaining the ground bounce at an acceptable level. The output buffer circuit also includes means for minimizing crowbar current when the data input signal changes from a high logic level to a low logic level.

SUMMARY OF THE INVENTION

Accordingly, it is a general aspect of the present invention to provide an output buffer circuit which is relatively simple and inexpensive to design and manufacture, but yet overcomes the disadvantages of prior art output buffer circuits.

It is also an aspect of the present invention to provide an output buffer circuit which minimizes the propagation delay of the output buffer circuit when the data input signal changes from a high logic level to a low logic level by speeding up the initial rate of fall of the output signal while maintaining the ground bounce at an acceptable level.

It is another aspect of the present invention to provide an output buffer circuit which includes a small propagation delay for coupling the data input signal quickly to speed up the initial rate of fall of the output signal so as to minimize the propagation delay of the output buffer circuit when the data input signal changes from a high logic level to a low logic level.

It is yet another aspect of the present invention to provide an output buffer circuit which includes means for minimizing power consumption by reducing crowbar current when the data input signal changes from a high logic level to a low logic level.

It is still another aspect of the present invention to provide an output buffer circuit with small propagation delay for coupling the data input signal quickly so as to minimize crowbar current when the data input signal changes from a high logic level to a low logic level.

It is yet another aspect of the present invention to provide an output buffer circuit which includes two separate ground potential terminals for minimizing ground bounce when the data input signal changes from a high logic level to a low logic level.

In accordance with these aims and aspects, the present invention is concerned with the provision of an output buffer circuit which has minimal propagation delay and crowbar current.

The output buffer circuit of the present invention includes a pull-up transistor responsive to the data input signal for providing a first drive potential, a first pull-down transistor responsive to the data input signal for providing a second drive potential, a speed improvement circuit coupled to the first pull-down transistor and a crowbar current reduction circuit coupled to the pull-up transistor.

The speed improvement circuit includes a second pull-down transistor coupled to the first pull-down transistor. The second pull-down transistor is smaller than the first pull-down transistor and is responsive to the change of the data input signal state from the second state to the first state so as to speed up the rate of fall of the output signal for a portion of the time when the output signal is making a corresponding transition from the second state to the first state for minimizing propagation delay.

The crowbar current reduction circuit includes a first crowbar current reduction transistor coupled to the pull-up transistor. The first crowbar current reduction transistor is smaller than the pull-up transistor and is responsive to the change of the data input signal state from the second state to the first state so as to speed up the turning off of the pull-up transistor when the output signal is making a corresponding transition from the second state to the first state for minimizing crowbar current.

The output buffer circuit of the present invention further includes logic gates with small propagation delay for coupling the data input signal to the second pull-down transistor and the first crowbar current reduction transistor for speeding up the initial rate of fall of the output signal and for speeding up the turning off of the pull-up transistor respectively.

The output buffer circuit of the present invention also includes a split VSS metal bus and a split package lead for minimizing the amount of noise generated on the internal chip's VSS metal bus as a result of current surge when the pull-down transistor is turned ON.

BRIEF DESCRIPTION OF THE DRAWINGS

These and other aspects and advantages of the present invention will become more fully apparent from the following detailed description when read in conjunction with the accompanying drawings with like references numerals indicating corresponding parts throughout, wherein.

DESCRIPTION OF THE PREFERRED EMBODIMENT

The present invention relates to a high speed CMOS output buffer which has minimal propagation delay and transient crowbar current. The following description is presented to enable one of ordinary skill in the art to make and use the invention and is provided in the context of a patent application and its requirements. Various modifications to the preferred embodiment will be readily apparent to those skilled in the art. Accordingly, the present invention should only be limited by the generic principles and features described herein.

Figure 1:
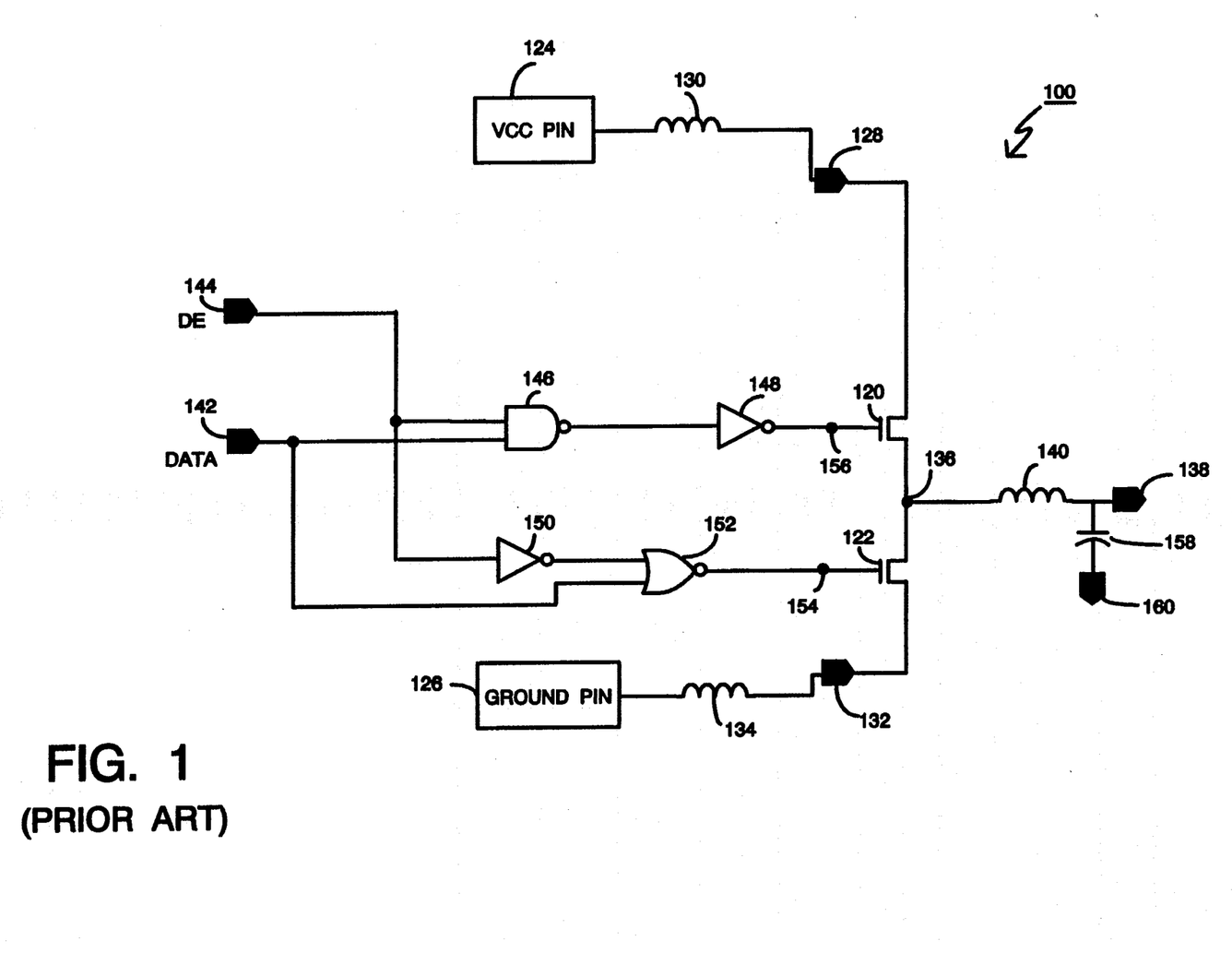
FIG. 1 is a schematic circuit diagram of a prior art output buffer circuit.

In FIG. 1, there is shown a simplified schematic circuit diagram of a typical output buffer circuit 100 which is formed in a semiconductor integrated circuit chip. Output buffer circuit 100 uses a pull-up transistor device 120 and a pull-down transistor device 122 connected in series between first external power supply terminal VCC PIN 124 and second external power supply terminal GROUND PIN 126. As shown in FIG. 1, and throughout the following description, N-channel field effect transistors are used for both pull-up and pull-down transistors, The use of a N-channel field effect transistors in this description is for the purpose of example only. One of ordinary skill in the art will readily recognize from the following description and the accompanying drawings and corresponding circuits could utilize other types of transistors, i.e. P-channel field effect transistors.

In FIG. 1, the first power supply terminal pin VCC PIN 124 may be supplied with a positive potential VCC (typically at +5.0 volts) which is connected to an internal power supply node VCC 128 via a lead line with parasitic inductance represented by inductor 130. The drain of transistor 120 is also connected to the node VCC 128. The inductor 130 represents the inductance of the internal chip's VCC metal bus connecting to the drain of the transistor 120, the inductance of the bond wire used to connect the VCC metal bus to the terminal VCC PIN 124, and the package inductance associated with terminal VCC PIN 124 itself. The second power supply terminal GROUND PIN 126 may be supplied with a ground potential VSS (typically at 0 volts) which is connected to an internal potential node VSS 132 via a lead line having parasitic inductance represented by inductor 134. The source of transistor 122 is also connected to the node VSS 132. The inductor 134 represents the inductance of the internal chip's VSS metal bus connecting to the source of transistor 122, the inductance of the bond wire connecting the VSS metal bus to the terminal GROUND PIN 126, and the package inductance associated with terminal GROUND PIN 126 itself. The common connection point of transistor 120 and transistor 122 defines an internal output node 136 which is further jointed to an external output terminal 138 via a third connection lead having associated package and bond wire inductance as represented by inductor 140. The external output terminal pin is used for driving other integrated circuits which may have widely varying capacitive loading effects.

The output buffer circuit 100 provides an output signal at the output terminal 138 in response to a data input signal DATA received at a data input terminal 142 and an enable signal DE received at data enable input terminal 144. Terminal 142 and terminal 144 are coupled to the input of an NAND logic gate 146. The output of NAND logic gate 146 is coupled to an inverter 148. The output of inverter 148 is coupled to the gate of transistor 120. Terminal 144 is also coupled to an inverter 150. The output of inverter 150 is coupled to the input of a NOR logic gate 152. Terminal 142 is also coupled to the input of NOR logic gate 152. The output of NOR logic gate 152 is coupled to a node 154 and node 154 is coupled to the gate of transistor 122. An external capacitive load 158 is coupled to the output terminal 138 and also to an external ground terminal 160.

When enabled, the DE signal level is at logic "1" The propagation delay of the output buffer is the delay time for the DATA signal to travel from terminal 142 to output terminal 138. When the DATA signal makes a low-to-high transition, the outputs of NAND logic gate 146 and NOR logic gate 152 make a high-to-low transition after one gate delay. Node 154 goes low and turns OFF transistor 122. Also, the output of inverter 148 goes low-to-high after another gate delay. Node 156 goes high and turn ON transistor 120. Output terminal 138 goes low-to-high following node 136.

Similarly, when the DATA signal makes a high-to-low transition, the outputs of the NAND logic gate 146 and the NOR logic gate 152 make a low-to-high transition after one gate delay. Node 154 goes high and turns ON transistor 122. Also, the output of the inverter 148 goes high-to-low after another gate delay. Node 156 goes low and turns OFF transistor 120. Output terminal 138 goes high-to-low following node 136.

The propagation delay corresponding to the DATA signal going high-to-low and then the output terminal 138 going high-to-low often times is slower than the propagation delay corresponding to the DATA signal going low-to-high and then the output terminal 138 going low-to-high because of two reasons. First, the circuit before the output buffer circuit 100 in an integrated circuit chip might have a large time skew in which the high-to-low DATA signal arriving at terminal 142 is much slower than the low-to-high DATA signal. Second, when the output signal at the output terminal 138 goes high-to-low, the transient current from switching the external capacitive loading 158 will go across transistor 122 and eventually across inductor 134. This transient current, called $I_{otr}$ will cause momentarily a ground bounce voltage $V_{gb}$, where $$V_{gb} = \text{(Inductance of Inductor 134)} \times d/dt\,(I_{otr}).$$

As a result, the source of transistor 122 is not at ground potential (0 volt) but at $V_{gb}$ during this time period. The voltage across the drain and the source of transistor 122 is then decreased, causing it to become smaller in current strength to discharge the capacitive load 158.

Attempts have been made in the prior art of output buffer design to speed up the high-to-low transition of the output terminal. The transistor 122 has been made stronger in current strength by increasing its size so as to discharge the capacitive load 158 and pull down low the output terminal 138 faster. But this solution has several drawbacks as follows:

First, the larger transistor 122 will have larger gate-to-drain and gate-to-source capacitance and will slow down the rise time at node 154. If transistor 122 is made too large, the slower rise time at node 154 caused by transistors 122's larger parasitic capacitance will offset transistor 122's stronger pull-down action. If this is the case, the excessive large pull-down transistor 122 with its large gate capacitance must be buffered by adding additional buffers, such as two inverters in series, between the output of NOR logic gate 152 and node 154 to speed up the rise time at node 154. Buffering will be necessary because the NOR logic gate 152 will be too weak to drive the heavy parasitic gate capacitance of transistor 122. By adding the two inverters which has stronger drive than the NOR logic gate, the rise time at node 154 will be improved. However, due to serial delays of the extra inverters, the propagation delay from the DATA input terminal 142 to node 154 will increase. This will somewhat offset the improvement of the rise time at node 154. As a result, the overall improvement in propagation delay by simply increasing the size of the output transistor 122 is minimal.

Second, when the larger transistor 122 is turning ON, it will create a large surge of current, $I_{otr}$, caused by switching of the external capacitive loading 158. This transient current comes from the external capacitive loading 158 and goes toward the drain of transistor 122 and finally toward the terminal GROUND PIN 126. The voltage at GROUND PIN 126 will jump up momentarily to $V_{gb}$ from ground potential (0 volt) due to this large current surge across the inductor 134. Oscillation will appear on the internal chip's VSS metal bus. This noise is a major problem encountered in designing high speed output buffers since it will cause false data sensing and degradation of the output logic levels.

Third, there exists a condition in which the pull-up transistor 120 is still turned ON temporarily as it is being turned OFF while the pull-down transistor 122 is being turned ON, resulting in a cross-over current commonly known as crowbar current due to their simultaneous conduction. This crowbar current comes from the terminal VCC PIN 124, goes across transistors 120 and 122, and goes to the terminal GROUND PIN 126. A larger transistor 122 in the output buffer will increase the amount of the crowbar current due to its stronger drive and slower turn-off time while transistor 120 is still ON. As explained earlier, high crowbar current will cause an undesirable high total power consumption of the integrated circuit. Thus making the pull-down transistor 122 large to gain speed is not an optimal solution.

Figure 2:
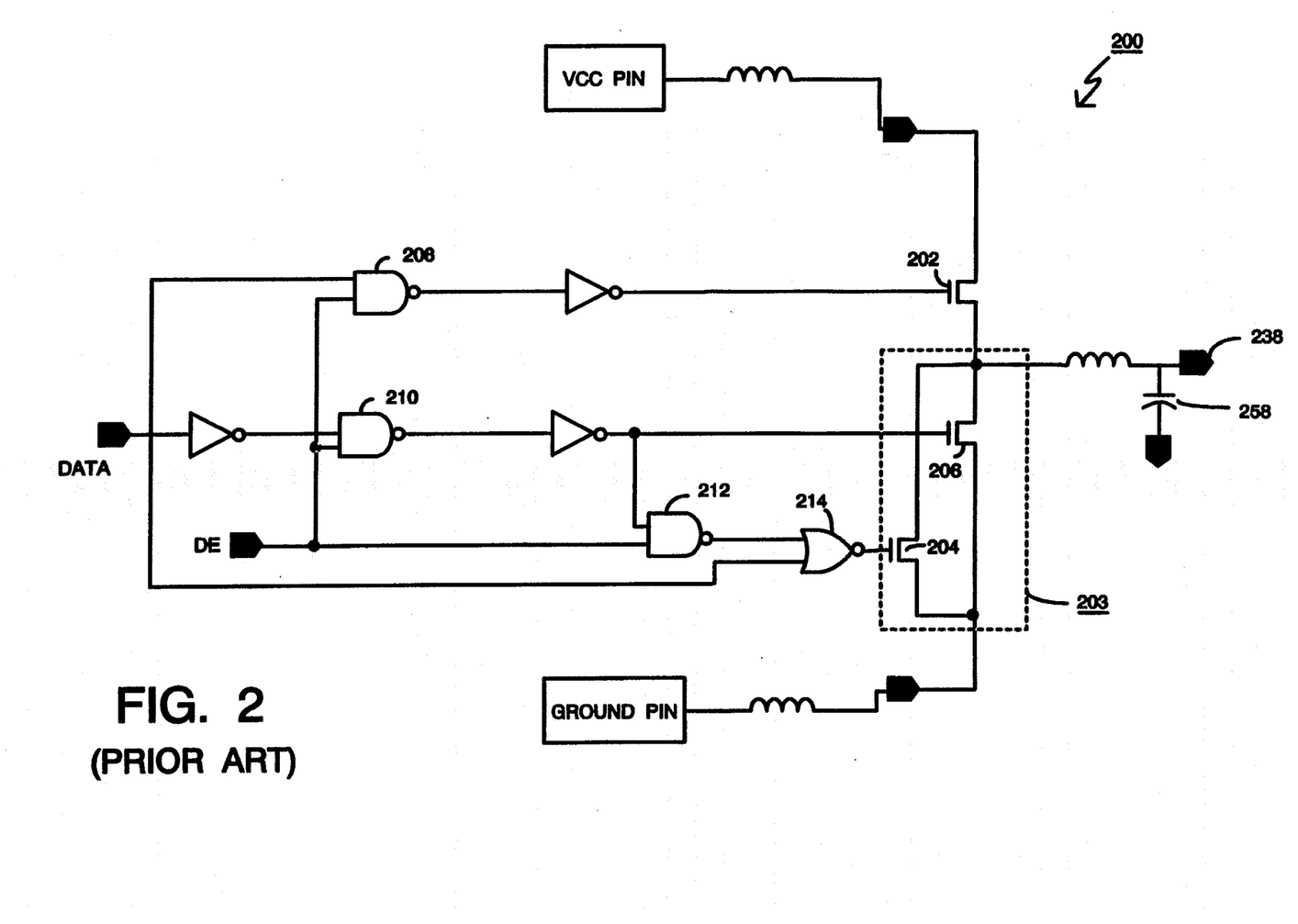
FIG. 2 is a schematic circuit diagram of a second prior art output buffer circuit.

In FIG. 2, there is shown a schematic circuit diagram of another prior art output buffer circuit 200 which includes a pull-up transistor 202 and a staged pull-down means 203 formed of two N-channel transistors 204 and 206 connected in parallel. NAND logic gates 208, 210, 212 and NOR logic gate 214 are provided for turning transistors 202, 204 and 206 ON and OFF in the correct sequence. This scheme avoids the use of a larger effective pull-down transistor to improve the high-to-low transition on output terminal 238 by using a small transistor 204 which initiates a turn-on time much quicker than the other larger transistor 206. The effective size of transistors 204 and 206 combined together is the same as only one large pull-down transistor is used. The large transistor 206 turns ON later after transistor 204 to provide the necessary drive for the capacitive loading at the output terminal 238. The quick turn-on of transistor 204 provides a initial "kick" to speed up the high-to-low output signal transition.

Although this scheme exhibits improvement in speed over the previous version in as shown in FIG. 1, some major weaknesses still exist. First, the rise time on the output node of 214 is slow and thus the turn-on time of 204 is also slow because this node is driven by a NOR gate, which has an inherent rise time slower than an inverter gate. Using NOR logic gate 214 to drive the smaller pull-down transistor 204 results in poor speed performance. Second, the oscillation and noise on the internal chip's VSS metal bus is still a major problem due to the current surge when pull-down transistors 204 and 206 are turned ON. Third, crowbar current has not been minimized because no scheme has been developed to turn OFF the pull-up transistor 202 quickly before the pull-down transistors 204 and 206 are turned ON.

Figure 3:
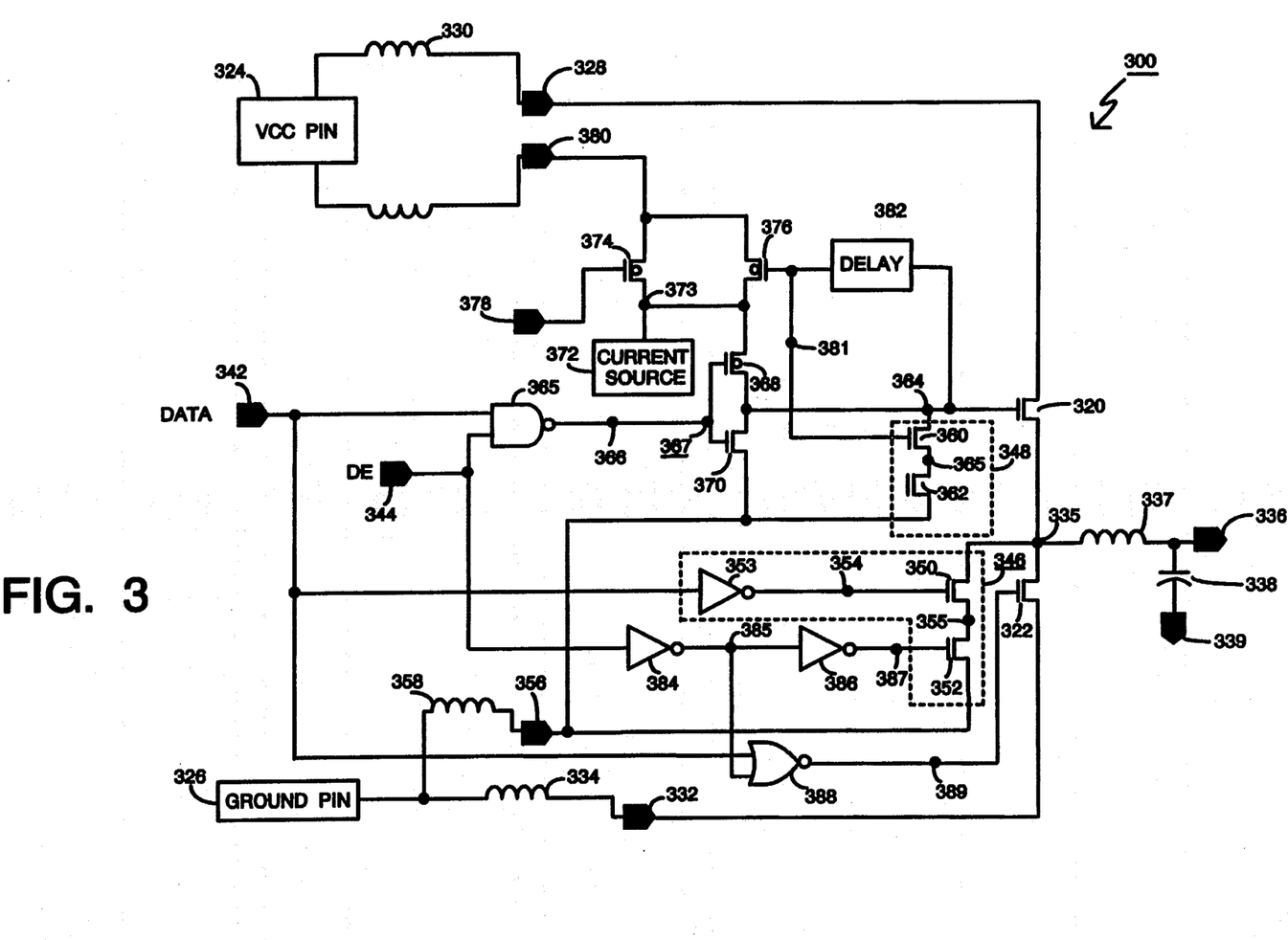
FIG. 3 is a schematic circuit diagram of a high speed output buffer which has minimal propagation delay and minimal transient crowbar current, constructed in accordance with the principles of the present invention.

Turning now to FIG. 3 which illustrates a high speed output buffer circuit 300 constructed in accordance with the present invention.

Output buffer circuit 300 uses a pull-up transistor device 320 and a pull-down transistor device 322 connected in series between first external power supply terminal VCC PIN 324 and second external power supply terminal GROUND PIN 326. The first power supply terminal VCC PIN 324 may be supplied with a positive potential VCC (typically at +5.0 volts) which is connected to an internal power supply node VCCO 328 via a lead line parasitic inductance 330. The drain of transistor 320 is also connected to the node VCCO 328. The parasitic inductance 330 represents the inductance of the internal chip's VCCO metal bus connecting to the drain of the transistor 320, the inductance of the bond wire used to connect the VCCO metal bus to the terminal VCC PIN 324, and the package inductance associated with terminal VCC PIN 324 itself. The second power supply terminal GROUND PIN 326 may be supplied with a ground potential VSS (typically at 0 volts) which is connected to an internal potential node VSSO 332 via a lead line having parasitic inductance 334. The source of transistor 322 is also connected to the node VSSO 332 which is connected to the terminal GROUND PIN 326 of the package via inductor 334. The parasitic inductor 334 represents the inductance of the internal chip's VSSO metal bus connecting to the source of transistor 322, the inductance of the bond wire connecting the VSSO metal bus to terminal 326, and the package lead inductance associated with terminal 326. The common connection point of transistor 320 and transistor 322 defines an internal output node 335 which is further joined to an external output terminal 336 via a third connection lead having associated package and bond wire inductance 337.

The output buffer circuit 300 provides an output signal at the output terminal 336 in response to a data input signal DATA received at a data input terminal 342 and an enable signal DE received at data enable input terminal 344. The external output terminal 336 is used for driving other integrated circuits which may have widely varying capacitive loading effects. In this embodiment, an external capacitive load 338 is coupled to the output terminal 336 and also to an external ground terminal 339.

The output buffer circuit 300 includes a speed improvement circuit 346 and a crowbar current reduction circuit 348. Speed improvement circuit 346 comprises transistor 350, transistor 352 and inverter 353. Both transistors 350 and 352 are smaller than transistor 322. The input of inverter 353 is coupled to terminal 342, the output of inverter 353 is coupled to a node 354 and node 354 is coupled to the gate of transistor 350. The drain of transistor 350 is coupled to node 335, while its source is coupled to a node 355 and node 355 is coupled to the drain of transistor 352. The source of transistor 352 is coupled to an internal potential node VSS 356. Node 356 is coupled to parasitic inductor 358 and parasitic inductor 358 is coupled to terminal 326. Parasitic inductor 358 represents the inductance of the internal chip's VSS metal bus connecting to the source of transistor 352, the inductance of the bond wire connecting the VSS metal bus to terminal 326, and the package lead inductance associated with terminal 326.

The crowbar current reduction circuit 348 comprises transistor 360 and 362. Both transistors 360 and 362 are smaller than transistor 320. The drain of transistor 360 is coupled to the gate of transistor 320 and to a node 364. The source of transistor 360 is coupled a node 365 and node 365 is coupled to the drain of transistor 362. The source of transistor 362 is coupled to node 356 and the gate of transistor 362 is coupled to the output of inverter 353.

Terminal 342 is coupled to a first input of a NAND logic gate 365. Terminal 344 is coupled to a second input of NAND logic gate 365. The output of NAND logic gate 365 is coupled to node 366 and node 366 is coupled to an inverter 367 formed of transistors 368 and 370. Transistor 368 is a P-channel transistor and transistor 370 is a N-channel transistor. Node 366 is coupled to the gates of transistor 368 and 370. The drain of transistor 368 is coupled to the drain of transistor 370 and then coupled to node 364. The source of transistor 370 is coupled to node 356.

Output buffer circuit 300 further includes a current source 372 coupled to a node 373 and node 373 is coupled to the sources of two P-channel transistor 374 and 376. The gate of transistor 374 is coupled to a node VSS 378 which is coupled to VSS. The source of both transistor 374 and transistor 376 are coupled to node VCC 380. The present invention will function well even if node VCC 380 and node VCC0 328 are connected together. The gate of transistor 376 is coupled to a node 381 and node 381 is coupled to the gate of transistor 360 and also to the output of a DELAY circuit 382. The input of DELAY 382 is coupled to node 364.

Terminal 344 is also coupled to the input of an inverter 384. The output of inverter 384 is coupled to a node 385 and node 385 is coupled to the input of yet another inverter 386. The output of inverter 386 is coupled to a node 387 and node 387 is coupled to the gate of transistor 352. Terminal 342 is coupled to one of the inputs of a NOR logic gate 388. The output of inverter 384 is coupled to the other input of NOR logic gate 388. The output of NOR logic gate 388 is coupled to a node 389 and node 389 is coupled to the gate of transistor 322.

Initially, it will be assumed that the data input signal DATA and the enable signal DE are active HIGH (DATA=DE=1). Then, the output of the inverter 384 on node 385 is active LOW and the output of the inverter 386 on node 387 is active HIGH. Transistor 352 s turned ON. Also, the output of the NAND logic gate 365 on node 366 is active LOW and drives the input of the inverter 367 formed of transistors 368 and 370. Since node 366 is active LOW, transistor 370 is turned OFF and transistor 368 is turned ON. Transistors 368 and 374 pull node 364 to active HIGH because their gates are tied to LOW and ground potential (VSS), respectively. Because node 364 is active HIGH, the output pull-up transistor 320 is conductive. Node 381 is active HIGH also because the DELAY circuit does not change the logic level of the input node 364. As a result, transistor 376 is turned OFF and transistor 360 is turned ON. Moreover, the outputs of the inverter 353 on node 354 and the NOR logic gate 388 on node 389 is active LOW so as to turn OFF the pull-down transistors 350 and 322. Therefore, in this case where DATA=DE=1, the pull-up transistor 320 is turned ON and both pull-down transistors 350 and 322 are turned OFF so that the output terminal 336 is at logic HIGH level.

When the data input signal DATA makes a high-to-low transition and the enable signal DE is still active HIGH (DATA=1 to 0, DE=1), the data input signal DATA will switch to active LOW. The output of the NAND logic gate 365 on node 366 will switch from LOW to HIGH and will drive the input of inverter 367 causing its output on node 364 to switch from HIGH to LOW and the pull-up transistor 320 to turn OFF. After a time delay, node 381 will switch from HIGH to LOW also. As a result, transistor 376 will turn ON and transistor 360 will turn OFF. Moreover, the output of the inverter 353 on node 354 will switch from LOW to HIGH and the pull-down transistor 350 will be conductive because transistor 352 is already turned ON when the enable signal DE is HIGH. Also, the output of the NOR gate 388 on node 389 will switch from LOW to HIGH so as to turn ON the pull-down transistor 322. Therefore, both pull-down transistors 350 and 322 will be conductive and the pull-up transistor 320 will be turned OFF so that the output terminal 336 will be at logic LOW level.

When the data input signal DATA is making a high-to-low transition and the enable signal DE is still active HIGH (DATA=1 to 0, DE=1), the speed improvement circuit 346 and the crowbar reduction circuit 348 will go into effect for minimizing propagation delay and crowbar current, as explained in the following.

In a critical path, the fastest propagation delay is achieved by using the fastest logic gates driving the minimal output capacitive loading. In an integrated circuit chip using CMOS technology, the type of logic gate with fastest propagation delay is the inverter gate, for example inverter 353. The internal output capacitive loading of a gate consists of, to a large degree, the total parasitic gate electrode capacitance of all the field-effect transistors on the output. Also, a well known fact is that the smaller the transistor, the smaller the gate electrode capacitance due to the reduced area of the gate polysilicon over the transistor active region. Ideally, to achieve the fastest propagation delay, the critical path would be designed with minimal number of inverter gates driving small transistors and yet implementing the logic correctly.

In FIG. 3, the high-to-low data input signal DATA goes into the NOR logic gate 388 and causes its output on node 389 to go low-to-high to turn ON the pull-down transistor 322. The propagation delay on this critical path is slow for two main reasons. First, the NOR logic gate 388 is poor in propagation delay performance compared with an inverter gate, such as inverter 353. Second, to drive a heavy output terminal capacitive load 338, the pull-down transistor 322 must be sufficiently large which creates a large parasitic gate electrode capacitance on the output of NOR gate 388 and therefore degrades performance.

These problems are solved by creating a faster parallel data path to turn ON the pull-down transistor faster. This is achieved by logic implementation using inverter 384, inverter 386, and the speed improvement circuit formed of inverter 353, transistor 350 and transistor 352. A single stage using an inverter 353 is used to turn ON the second pull-down transistor 350, thus improving the performance over the NOR logic gate 388. The second pull-down transistor 350 is made sufficiently smaller than the first pull-down transistor 322, thus reducing significantly the amount of parasitic gate electrode capacitance on the output of the inverter 353 and improving the turn-on time of the pull-down transistor 350. Transistor 352 is made sufficiently large to be very conductive so as to make the voltage on node 355 look like ground potential VSS. The delay path from the enable signal DE terminal 344 to the gate electrode of transistor 352 is not so critical because it does not interfere with the data path of the data input signal DATA. Therefore, the large parasitic gate electrode capacitance of transistor 352 loading on the output of inverter 386 and the two serial gate delays of inverter 384 and 386 will not result in any delay penalty in the path of the data input signal DATA. The smaller pull-down transistor 350 will sense the transition change of the data input signal DATA ahead of the larger pull-down transistor 322. When the data input signal DATA is switching high-to-low, the smaller pull-down transistor 350 will turn ON first and then later the larger pull-down transistor 322 will turn ON. The smaller pull-down transistor provides an initial "kick" to speed up the switching high-to-low of the output signal at the output terminal 336.

Although the NOR logic gate 388 and the large pull-down transistor 322 may be deleted without changing the logic level at the output terminal 336, conceivably a fast output buffer could be achieved by simply taking out transistor 322 and the NOR logic gate 388 and enlarging 350 to drive the heavy output capacitive load 338. If this is the case, only a portion of the output buffer circuit containing inverter 353, inverter 386, inverter 384, transistor 350, and transistor 352 is used for the pull-down action. But doing this method will have a serious problem of transient noise on the VSS metal bus to which all the other internal circuits of an integrated circuit chip are connected. When the output terminal 336 is switching high-to-low, a large surge of current from the capacitive load 338 will go to the drain of the pull-down transistors. If the pull-down transistor 350 is made very large, then it becomes more conductive and more of this large current surge will go to the internal VSS metal bus. The voltage on node VSS will jump up momentarily from ground potential due to this current across the parasitic inductor 358. As a result, noise will appear on the VSS internal metal bus and will cause false data sensing internally in the integrated circuit chip and degradation of the logic level on the output terminal 338.

Thus, two parallel pull-down transistors are recommended in this output buffer design. The smaller output pull-down transistor 350 has its source virtually connected to the VSS metal bus which is connected to the terminal 326 of the package via inductor 358. The parasitic inductor 358 represents the inductance of the internal chip's VSS metal bus connecting to the source of transistor 352, the inductance of the bond wire connecting the VSS metal bus to the terminal 326, and the package lead inductance associated with terminal 326. Not much of the surging current will go to the VSS metal bus in this situation because transistor 352 is small and the VSS metal bus will be quiet. The larger pull-down transistor 322 has its source connected to the VSSO metal bus which is connected to the terminal 326 of the package via inductor 334. The parasitic inductor 334 represents the inductance of the internal chip's VSSO metal bus connecting to the source of transistor 322, the inductance of the bond wire connecting the VSSO metal bus to the terminal 326, and the package lead inductance associated with terminal 326. Much of the surging current will go the VSSO metal bus, but noise on this bus is not so critical because no sensitive circuits in the integrated circuit chip will be connected to it.

Therefore, in order to obtain the best noise immunity result, two separate pull-down transistors with each connected to an individual metal bus (VSS and VSSO) are recommended. Furthermore, it is important to have two separate bond wires connecting the buses to the package leads. In this embodiment, the ground leads of the package which accommodates the integrated circuit chip is split internally to accommodate the two bond wires and joined externally to the common ground terminal 326 for the best result. Alternatively, the package may comprise multiple ground terminals, some of which are coupled to Vss while others are coupled to VSSO. In that case, the VSS ground terminals are electrically isolated from the VSSO ground terminals.

Next, the functioning of the crowbar current reduction circuit will be described.

When the data input signal makes a high-to-low transition, it is desired to turn OFF the pull-up transistor 320 faster than turn ON the pull-down transistors 350 and 322 to avoid the simultaneous cross-over current. Without the crowbar current reduction circuit, the normal delay path to turn OFF transistor 320 is two gate delays—one gate delay from the poor speed performance of the NAND logic gate 365 and another from the inverter 367 formed of transistor 368 and 370. The crowbar current reduction circuit includes inverter 353 and transistors 360 and 362. The crowbar current reduction circuit senses the data input signal DATA and bypasses the slow NAND logic gate 365 and inverter 367 to turn OFF the pull-up transistor 320 by pulling node 364 low by means of the low-to-high switching action of the speedy inverter 353 and turning on transistor 362. Transistor 360 is already conductive in this case because node 364 is initially HIGH which causes the gate electrode of transistor 360 on node 381 to be HIGH also. Since initially node 364 is logically HIGH, the P-channel transistor 376 is initially turned OFF and has no effect on this transition. The P-channel transistor 374, however, is always turned on since its gate electrode is connected to VSS and is used as a weak transistor for holding the source of transistor 368 at power supply voltage VCC. When transistor 376 is turned OFF, as in this case when node 364 is HIGH, the voltage on node 364 can be easily pulled low by transistors 360 and 362 since these transistors are much stronger than transistor 374. As a result, the gate electrode node 364 of the pull-up transistor receives an initial kick from the conduction of transistors 360 and 362 to pull it low faster. Transistor 370 will also help pull node 364 low after it turns ON at a later time. Thus, the delay to turn OFF transistor 320 has been improved with this crowbar current reduction technique and the amount of crowbar current is reduced.

Figure 4A:
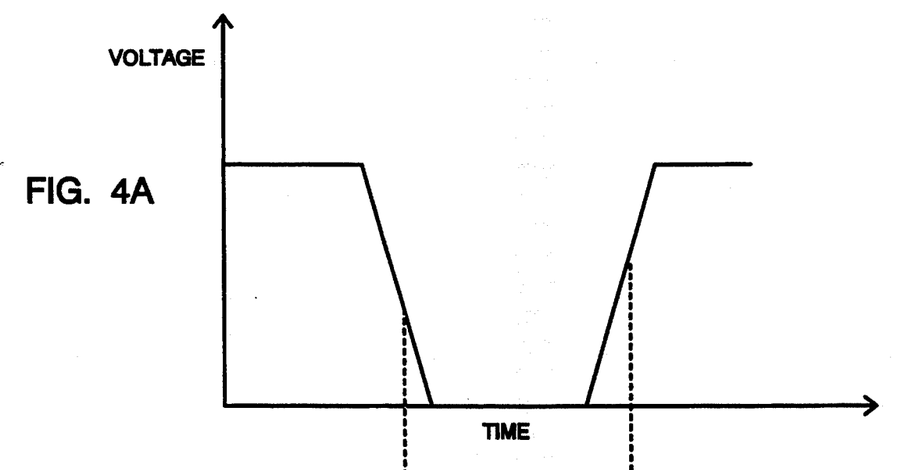
FIG. 4A, 4B and 4C illustrates respectively the waveform of the input DATA signal, the output using a prior art output buffer circuit, and the output signal using an output buffer circuit constructed in accordance with FIG. 3.
Figure 4B:
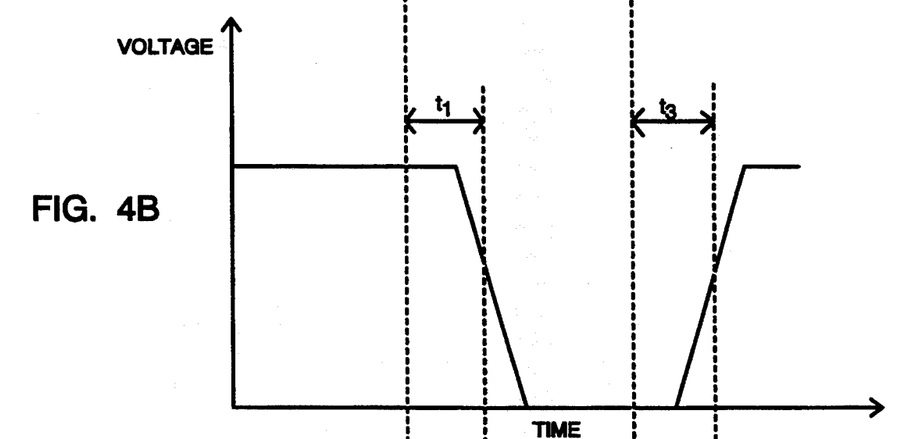
Figure 4C:
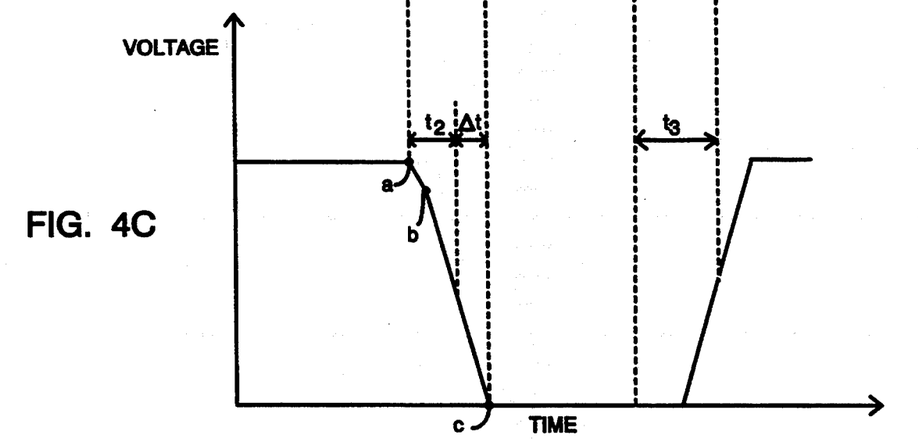

Turning now to FIG. 4A, 4B and 4C.

FIG. 4A shows the DATA input signal changing state from high-to-low and then from low-to-high.

FIG. 4B shows the response of the output signal at the output terminal of a prior art output buffer circuit. The propagation delay of the high-to-low output signal is represented by t1.

FIG. 4C shows the response of the output signal at the output terminal of an output buffer circuit constructed in accordance with FIG. 3. The propagation delay of the high-to-low output signal is represented by t2. The propagation delay is reduced by an amount equal to delta t. Point a on the output waveform shows the result of the initial "kick" provided by the smaller pull-down transistor 350 when transistor 350 starts turning ON. At point b, the stronger pull-down transistor 322 starts to turn ON as well. From point b through point c, both transistor 350 and 322 are conducting. The low-to-high output signal, as represented by t3, is the same for both prior art output buffer circuit and an output buffer constructed in accordance with FIG. 3.

In operation, when output terminal 336 switches from low-to-high, node 364 is initially LOW, and the node voltage on node 381 is initially LOW also, and transistor 360 is initially turned OFF. Since transistor 360 is nonconductive, transistor 362 is initially isolated from node 364 and has no impact on the low-to-high transition. Also, transistor 376 is initially turned ON so that the low-to-high delay on node 364 is not degraded because transistor 376 is designed very strong because of its large size so as to make the node 373 look as if it were VCC. Therefore, transistor 368 results in no pull-up degradation and the output terminal 336 switches from LOW to HIGH the same speed as the conventional output buffer. After node 364 and the output terminal 338 have been switched to active HIGH, node 381 will become active HIGH also but only after a finite time delay as determined by the DELAY circuit 382.

This delay is necessary in order to continue the isolation of any impact from transistor 362 until node 364 is stabilized at active HIGH. When that happens, transistor 360 will then become conductive, ready to respond again to the high-to-low data input signal DATA and to minimize the crowbar current by speeding up the pull-down action on node 364 as the whole cyclical process described above repeats itself.

Although the present invention has been described in accordance embodiments shown in the figures, one of ordinary skill in the art recognizes there could be variations to the embodiments and those variations would be within the spirit and scope of the present invention. Accordingly, many modifications may be made by one of ordinary skill in the art without departing from the spirit and scope of the appended claims.

What is claimed is:

1. An output buffer circuit for receiving a data input signal and for providing an output signal, the data input signal changing level from a first level to a second level and from a second level to a first level, the output signal changing level from a first level to a second level and from a second level to a first level, the output buffer circuit having minimal propagation delay, the output buffer circuit comprising:

a pull-up transistor coupled to an output terminal of the output buffer circuit and responsive to the data input signal to provide a first drive potential to an external element;

a first pull-down transistor responsive to the data input signal and coupled to the output terminal and to a first ground voltage to provide a second drive potential to the external element; and a speed improvement circuit coupled to the first pull-down transistor, the speed improvement circuit comprising:

a second pull-down transistor coupled to the first pull-down transistor and to a second ground voltage, the second pull-down transistor being smaller than the first pull-down transistor, the second pull-down transistor being responsive to the change of the data input signal level from the second level to the first level so as to speed up the rate of fall of the output signal for a portion of the time when the output signal is making a corresponding transition from the second level to the first level for minimizing propagation delay, and a fast logic gate, the logic gate being coupled to the second pull-down transistor, the logic gate receiving the data input signal and propagating the data input signal to the second pull-down transistor.

2. The output buffer circuit as recited in claim 1, wherein the fast logic gate is an inverter.

3. The output buffer circuit as recited in claim 1, wherein the speed improvement means further comprises a third pull-down transistor coupled between the second pull-down transistor and the second ground voltage for coupling the second pull-down transistor to the second ground voltage so as to speed up the rate of fall of the output signal for a portion of the time when the output signal is making a corresponding transition from the second level to the first level for minimizing propagation delay.

4. The output buffer circuit as recited in claim 1, wherein the first ground voltage equals the second ground voltage.

5. The output buffer circuit as recited in claim 3, wherein the first level is a low logic level and the second state is a high logic level.

6. An output buffer circuit for receiving a data input signal and for providing an output signal, the data input signal changing level from a first level to a second level and from a second level to a first level, the output signal changing level from a first level to a second level and from a second level to a first level, the output buffer circuit having minimal crowbar current, the output buffer circuit comprising:

a pull-up transistor coupled to an output terminal of the output buffer circuit and responsive to the data input signal to provide a first drive potential to an external element;

a first pull-down transistor responsive to the data input signal and coupled to the output terminal and to a first ground voltage to provide a second drive potential to the external element; and a crowbar current reduction circuit coupled to the pull-up transistor, the crowbar current reduction circuit comprising a first crowbar current reduction transistor coupled to the pull-up transistor, the first crowbar current reduction transistor being smaller than the pull-up transistor, the first crowbar current reduction transistor being responsive to the change of the data input signal level from the second level to the first level so as to speed up the turning off of the pull-up transistor when the output signal is making a corresponding transition from the second level to the first level for minimizing crowbar current.

7. The output buffer circuit as recited in claim 6, wherein the crowbar current reduction circuit further comprises a second crowbar current reduction transistor coupled between the pull-up transistor and the first crowbar current reduction transistor for providing an electrical isolation therebetween during the time when the output signal is making a transition from the first level to the second level and for providing an electrically conductive path therebetween during the time when the output signal is making a transition from the second state to the first level so as to speed up the turning off of the pull-up transistor for minimizing crowbar current.

8. The output buffer circuit as recited in claim 7, wherein the crowbar current reduction circuit further comprises a fast logic gate, the logic gate being coupled to the first crowbar current reduction transistor, receiving the data input signal and propagating the data input signal to the first crowbar current reduction transistor.

9. The output buffer circuit as recited in claim 8, wherein the fast logic gate is an inverter.

10. The output buffer circuit as recited in claim 7, wherein the first level is a low logic level and the second state is a high logic level.

11. An output buffer circuit for receiving a data input signal and for providing an output signal, the data input signal changing level from a first level to a second level and from a second level to a first level, the output signal changing level from a first level to a second level and from a second level to a first level, the output buffer circuit having minimal propagation delay and minimal crowbar current, the output buffer circuit comprising:

a pull-up transistor coupled to an output terminal of the output buffer circuit and responsive to the data input signal to provide a first drive potential to an external element;

a first pull-down transistor coupled to the output terminal and to a first ground voltage responsive to the data input signal to provide a second drive potential to the external element; and a speed improvement circuit coupled to the first pull-down transistor, the speed improvement circuit comprising a second pull-down transistor coupled to the output terminal, the first pull-down transistor and to a second ground voltage, the second pull-down transistor being smaller than the first pull-down transistor, the second pull-down transistor being responsive to the change of the data input signal level from the second level to the first level so as to speed up the rate of fall of the output signal for a portion of the time when the output signal is making a corresponding transition from the second level to the first level for minimizing propagation delay; and a crowbar current reduction circuit coupled to the pull-up transistor, the crowbar current reduction circuit comprising a first crowbar current reduction transistor coupled to the pull-up transistor and the second ground voltage, the first crowbar current reduction transistor being smaller than the pull-up transistor, the first crowbar current reduction transistor being responsive to the change of the data input signal level from the second level to the first level so as to speed up the turning off of the pull-up transistor when the output signal is making a corresponding transition from the second level to the first level for minimizing crowbar current.

12. The output buffer circuit as recited in claim 11, wherein the speed improvement circuit further comprises a third pull-down transistor coupled between the second pull-down transistor and the second ground voltage for coupling the second pull-down transistor to the second ground voltage so as to speed up the rate of fall of the output signal for a portion of the time when the output signal is making a corresponding transition from the second level to the first level for minimizing propagation delay.

13. The output buffer circuit as recited in claim 12 wherein the speed improvement circuit further comprises a fast logic gate, the logic gate being coupled to the second pull-down transistor for receiving the data input signal and propagating the data input signal to the second pull-down transistor.

14. The output buffer circuit as recited in claim 13, wherein the fast logic gate is an inverter.

15. The output buffer circuit as recited in claim 11, wherein the first ground voltage equals the second ground voltage.

16. The output buffer circuit as recited in claim 13, wherein the first state is a low logic level and the second level is a high logic level.

17. The output buffer circuit as recited in claim 11, wherein the crowbar current reduction means further comprises a second crowbar current reduction transistor coupled between the pull-up transistor and the first crowbar current reduction transistor to provide an electrical isolation therebetween during the time when the output signal is making a transition from the first level to the second level and to provide an electrically conductive path therebetween during the time when the output signal is making a transition from the second state to the first level so as to speed up the turning off of the pull-up transistor for minimizing crowbar current.

18. The output buffer circuit as recited in claim 17 wherein the crowbar current reduction circuit further comprises a fast logic gate, the logic gate being coupled to the first crowbar current reduction transistor for receiving the data input signal and propagating the data input signal to the first crowbar current reduction transistor.

19. The output buffer circuit as recited in claim 18, wherein the fast logic gate is an inverter.

20. The output buffer circuit as recited in claim 17, wherein the first level is a low logic level and the second state is a high logic level.

21. An output buffer circuit for receiving a data input signal at one input terminal and an enable signal at a second input terminal and for providing an output signal at an output terminal, the data input signal changing level from a low logic level to a high logic level and from a high logic level to a low logic level, the output signal changing level from a low logic level to a high logic level and from a high level to a low level, the output buffer circuit having minimal propagation delay and minimal crowbar current, the output buffer circuit comprising:

a first pull-up transistor coupled to the output terminal, the first pull-up transistor being responsive to the data input signal to provide a first drive potential at the output terminal to an external element;

a first pull-down transistor coupled to the output terminal and to a first ground voltage, the first pull-down transistor being responsive to the data input signal to provide a second drive potential at the output terminal to the external element;

a speed improvement circuit coupled to the output terminal, the speed improvement circuit being responsive to the change of the input data signal level from the high logic level to the low logic level for minimizing propagation delay, the speed improvement circuit comprising:

a second pull-down transistor coupled to the output terminal, the second pull-down transistor being smaller than the first pull-down transistor, the second pull-down transistor being responsive to the change of the data input signal level from the high logic level to the low logic level so as to speed up the rate of fall of the output signal for a portion of the time when the output signal is making a corresponding transition from the high logic level to the low logic level for minimizing propagation delay, a third pull-down transistor coupled between the second pull-down transistor and a second ground voltage, the third pull-down transistor being responsive to the enable signal and coupling the second pull-down transistor to the second ground voltage so as to speed up the rate of fall of the output signal for a portion of the time when the output signal is making a corresponding transition from the high logic level to the low logic level for minimizing propagation delay, and an inverter coupled to the second pull-down transistor, receiving the data input signal and propagating the data input signal to the second pull-down transistor; and a crowbar current reduction circuit coupled to the pull-up transistor, the crowbar current reduction circuit being responsive to the change of the data input signal level from the high logic level to the low logic level so as to speed up the turning off of the first pull-up transistor, the crowbar current reduction circuit comprising:

a first crowbar current reduction transistor coupled to the first pull-up transistor and the second ground voltage, the first crowbar current reduction transistor also coupled to the inverter, the first crowbar reduction current transistor being smaller than the first pull-up transistor, the first crowbar current reduction transistor being responsive to the change of the data input signal level from the high logic level to the low logic level so as to speed up the turning off of the pull-up transistor when the output signal is making a corresponding transition from the high logic level to the low logic level for minimizing crowbar current, and a second crowbar current reduction transistor coupled between the first pull-up transistor and the first crowbar current reduction transistor to provide an electrical isolation therebetween during the time when the output signal is making a transition from the low logic level to the high logic level and to provide an electrically conductive path therebetween during the time when the output signal is making a transition from the high logic level to the low logic level so as to speed up the turning off of the first pull-up transistor for minimizing crowbar current.

22. The output buffer circuit as recited in claim 21, wherein the first ground voltage equals the second ground voltage.

* * * * *